(12) United States Patent
Onkaraiah et al.

(10) Patent No.: US 10,566,055 B2
(45) Date of Patent: Feb. 18, 2020

(54) METHOD FOR PROGRAMMING A BIPOLAR RESISTIVE SWITCHING MEMORY DEVICE

(71) Applicant: COMMISSARIAT A L'ENERGIE ATOMIQUE ET AUX ENERGIES ALTERNATIVES, Paris (FR)

(72) Inventors: Santhosh Onkaraiah, Grenoble (FR); Marc Belleville, Saint Egreve (FR); Fabien Clermidy, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/764,790

(22) PCT Filed: Jan. 30, 2014

(86) PCT No.: PCT/EP2014/051753
§ 371 (c)(1),
(2) Date: Jul. 30, 2015

(87) PCT Pub. No.: WO2014/118255
PCT Pub. Date: Aug. 7, 2014

(65) Prior Publication Data
US 2015/0371705 A1    Dec. 24, 2015

(30) Foreign Application Priority Data
Jan. 30, 2013 (FR) ..................... 13 50796

(51) Int. Cl.
*G11C 13/00* (2006.01)
*G11C 14/00* (2006.01)
*H03K 3/356* (2006.01)

(52) U.S. Cl.
CPC ...... *G11C 13/0069* (2013.01); *G11C 13/0007* (2013.01); *G11C 13/0011* (2013.01);
(Continued)

(58) Field of Classification Search
CPC ............ G11C 13/0069; G11C 13/0007; G11C 13/0011; G11C 13/0061; G11C 14/009
(Continued)

(56) References Cited

U.S. PATENT DOCUMENTS 5,204,541 A * 4/1993 Smayling ............ H01L 27/0623
257/138
5,250,856 A * 10/1993 Burton ............ H03K 19/09448
326/110

(Continued)

OTHER PUBLICATIONS

U.S. Appl. No. 14/161,346, filed Jan. 22, 2014, US2014-0207948 A1, Romain Lemaire, et al.

(Continued)

*Primary Examiner* — Michael T Tran
(74) *Attorney, Agent, or Firm* — Oblon, McClelland, Maier & Neustadt, L.L.P.

(57) ABSTRACT

An electronic circuit including a bipolar switching memory device including first and second electrodes at terminals of which a programming voltage can be applied, the circuit including: a first mechanism applying, to the first electrode, a data signal having, during a time period d, a constant state 0 or 1; a second mechanism applying, to the second electrode, a control signal that alternates, during time period d, between state 1 and state 0, the control signal being same regardless of the state in which the memory device is programmed; a selection device allowing a current to flow into the memory device during a programming time included in time period d; and a change of state of the control signal taking place during the programming time.

19 Claims, 10 Drawing Sheets

(52) U.S. Cl.
CPC ........ *G11C 13/0061* (2013.01); *G11C 14/009* (2013.01); *H03K 3/356* (2013.01); *G11C 2013/0073* (2013.01); *G11C 2213/78* (2013.01); *G11C 2213/79* (2013.01); *G11C 2213/82* (2013.01)

(58) Field of Classification Search
USPC .......................................... 365/148, 189.011
See application file for complete search history.

(56) References Cited

U.S. PATENT DOCUMENTS

| | | | | |
|---|---|---|---|---|
| 5,619,151 A * | 4/1997 | Akioka | ................ | G11C 7/1051 |
| | | | | 327/103 |
| 5,966,324 A * | 10/1999 | Wada | ................ | H01L 27/1112 |
| | | | | 365/177 |
| 6,229,161 B1 * | 5/2001 | Nemati | ................ | G11C 11/39 |
| | | | | 257/133 |
| 6,295,241 B1 * | 9/2001 | Watanabe | ................ | G11C 7/062 |
| | | | | 365/177 |
| 6,496,407 B2 * | 12/2002 | Ashikaga | ................ | G11C 11/22 |
| | | | | 365/145 |
| 7,599,210 B2 * | 10/2009 | Okazaki | ................ | G11C 11/412 |
| | | | | 365/148 |
| 8,022,502 B2 * | 9/2011 | Kanzawa | ................ | G11C 13/0007 |
| | | | | 257/2 |
| 8,355,271 B2 * | 1/2013 | Rabkin | ................ | G11C 13/0069 |
| | | | | 365/148 |
| 8,630,113 B1 * | 1/2014 | Xu | ................ | G11C 11/34 |
| | | | | 365/175 |
| 9,305,644 B2 * | 4/2016 | Kellam | ................ | G11C 13/00 |
| 10,283,185 B2 * | 5/2019 | Luan | ................ | G11C 11/418 |
| 2002/0045301 A1 * | 4/2002 | Sicard | ................ | H01L 27/0266 |
| | | | | 438/197 |
| 2007/0041242 A1 * | 2/2007 | Okazaki | ................ | G11C 11/412 |
| | | | | 365/154 |
| 2007/0096219 A1 * | 5/2007 | Akino | ................ | H01L 27/0705 |
| | | | | 257/370 |
| 2007/0132049 A1 | 6/2007 | Stipe | | |
| 2007/0133258 A1 * | 6/2007 | Kim | ................ | H01L 27/1052 |
| | | | | 365/149 |
| 2007/0146012 A1 * | 6/2007 | Murphy | ................ | B82Y 10/00 |
| | | | | 326/99 |
| 2007/0217266 A1 * | 9/2007 | Kim | ................ | G11C 11/412 |
| | | | | 365/185.21 |
| 2008/0031037 A1 * | 2/2008 | Takeda | ................ | G11C 11/412 |
| | | | | 365/182 |
| 2009/0134910 A1 | 5/2009 | Murphy et al. | | |
| 2010/0080035 A1 * | 4/2010 | Venkatraman | ................ | G11C 17/16 |
| | | | | 365/104 |
| 2010/0110765 A1 | 5/2010 | Tian et al. | | |
| 2010/0220513 A1 | 9/2010 | Kim et al. | | |
| 2011/0235393 A1 | 9/2011 | Yoshihara et al. | | |
| 2011/0305068 A1 * | 12/2011 | Kitagawa | ................ | G11C 13/0026 |
| | | | | 365/148 |
| 2012/0243297 A1 * | 9/2012 | Katayama | ................ | G11C 11/1659 |
| | | | | 365/148 |
| 2012/0250442 A1 * | 10/2012 | Roy | ................ | G11C 11/4091 |
| | | | | 365/203 |
| 2012/0314485 A1 * | 12/2012 | Cai | ................ | G11C 11/41 |
| | | | | 365/156 |
| 2013/0235487 A1 * | 9/2013 | Natzke | ................ | G11B 21/02 |
| | | | | 360/75 |
| 2013/0308399 A1 * | 11/2013 | Kohli | ................ | G11C 7/227 |
| | | | | 365/189.16 |
| 2014/0160840 A1 * | 6/2014 | Chen | ................ | G11C 5/14 |
| | | | | 365/182 |
| 2014/0207948 A1 | 7/2014 | Lemaire et al. | | |
| 2015/0048864 A1 | 2/2015 | Fanet et al. | | |
| 2017/0221562 A1 * | 8/2017 | Buchanan | ................ | G11C 13/0064 |
| 2017/0288547 A1 * | 10/2017 | Takamatsu | ................ | H02M 3/00 |

OTHER PUBLICATIONS

U.S. Appl. No. 14/452,698, filed Aug. 6, 2014, US2015-0048864, Herve Fanet, et al.
U.S. Appl. No. 14/762,040, filed Jul. 20, 2015, Romain Lemaire, et al.
Michael Kund, et al., "Conductive bridging RAM (CBRAM): An emerging non-volatile memory technology scalable to sub 20nm," IEDM Technical Digest, IEEE International, 2005 (4 pages).
Weisheng Zhao, "Spin-MTJ based Non-Volatile Flip-Flop," Proceedings of the 7$^{th}$ IEEE International Conference on Nanotechnology, Aug. 2-5, 2007 (4 pages).
H.-S. Philip Wong, "Emerging Memories: Are They Energy Efficient Enough?," Talk or Presentation, Stanford University, Nov. 2011 (36 pages).
Pierre-Emmanuel Gaillardon, et al., "Emerging Memory Technologies for Reconfigurable Routing in FPGA Architecture," Electronics, Circuits and Systems (ICECS), 2010 IEEE, 2010, pp. 62-65.
Pierre-Emmanuel Gaillardon, et al., "Phase-Change-Memory-Based Storage Elements for Configurable Logic," published in Field-Programmable Technology (FPT), IEEE 2010, Dec. 2010, pp. 17-20.
Shinichi Yasuda, et al., "Nonvolatile Configuration Memory Cell for Low Power Field Programmable Gate Array," Memory Workshop (IMW), 2011 3$^{rd}$ IEEE International, 2011 (4 pages).
Vaughn Betz, Thesis "Architecture and CAD for Speed and Area Optimization of FPGAs," National Library of Canada, Graduate Department of Electrical and Computer Engineering, University of Toronto, 1998 (228 pages).
International Search Report dated Apr. 14, 2014 in PCT/EP2014/051753 filed Jan. 30, 2014.
French Search Report dated Sep. 18, 2013 in FR1350796 filed Jan. 30, 2013.

* cited by examiner

METHOD FOR PROGRAMMING A BIPOLAR RESISTIVE SWITCHING MEMORY DEVICE

TECHNICAL FIELD

The invention relates to a method for programming at least one bipolar switching memory device, for example a CBRAM or RRAM device, as well as a method for programming a differential memory cell comprising at least two bipolar switching memory devices. The invention also relates to an electronic circuit comprising at least one bipolar switching memory device and designed to program the memory device.

PRIOR ART

Several types of non-volatile memories exist, for example magnetic memories (MRAM, STTRAM), phase change memories (PCRAM) or resistive memories (CBRAM, RRRAM or ReRAM, OxReRAM). These memories can store at least two different states in a non-volatile manner. These memories are either unipolar, i.e. they can be programmed in either of the two memory states by applying different value writing voltages or currents, however with the same polarity, or bipolar, i.e. they can be programmed in either of the two memory states by applying writing voltages or currents with opposite polarities, for example by flowing currents through the memory in opposite directions.

In one resistive-type memory component, the passage from a first memory state to a second memory state corresponds to a sudden change between a HRS (High-Resistance State or OFF state) and an LRS (Low-Resistance State or ON state). Such a bipolar resistive-type memory component comprises a stack of an active electrode formed on a solid electrolyte, itself formed on an inert electrode. The solid electrolyte which, for example, comprises chalcogenide, oxide, nitride, carbide or even amorphous silicon, is used as memory material. The active electrode comprises a metal such as silver or copper and is capable of releasing ions, for example $Ag^+$ or $Cu^{2+}$ type ions in order to form conductive filaments between the two electrodes when the memory component is in the ON state. The inert electrode comprises, for example, a metal such as tungsten or platinum.

When a positive voltage is applied between the active electrode and the inert electrode (positive electric potential on the active electrode and zero electric potential on the inert electrode), the active electrode oxidises and metal ions (for example $Ag^+$ or $Cu^{2+}$ type ions depending on the nature of the active electrode metal) are released by the active electrode into the electrolyte towards the inert electrode to form conductive filaments electrically linking the two electrodes. The growth of these conductive filaments between the two electrodes enables the memory component to change from the OFF state to the ON state.

When a negative voltage is applied between the active electrode and the inert electrode (negative electric potential on the active electrode and zero electric potential on the inert electrode), the conductive filaments are dissolved, thus enabling the memory component to change from the ON state to the OFF state.

Such bipolar programming memory devices therefore have the disadvantages of requiring the application of a negative voltage at the electrode terminals of the memory device, via the application of a negative electric potential on the active electrode, in order to programme one of the memory states (OFF state).

When a negative electric potential cannot be used to programme this OFF state, it must be possible to switch the data signal from both sides of the memory device, i.e. on the active electrode or on the inert electrode depending on the memory state to be programmed, with, in this case, a data signal corresponding to a positive electric potential to indicate a state 1 and corresponding to a zero electric potential to indicate a state 0. However, this requires the creation of complex routing and switching circuits, such as those described in documents US 2010/110765 A1 and US 2007/132049 A1.

DESCRIPTION OF THE INVENTION

One purpose of this invention is to propose a method for programming a bipolar switching memory device, whose programming does not require the use of negative electric potentials or complex routing and switching circuits to carry a data signal from both sides of the memory device.

For this purpose, this invention proposes a method for programming a first bipolar switching memory device comprising first and second electrodes at the terminals of which a programming voltage capable of programming the first memory device in a high-resistance or low-resistance state is intended to be applied, the method comprising at least the following steps:

application, to the first electrode of the first memory device, of a data signal having, during a time period d, a constant state 0 or 1, representative of the state in which the first memory device is intended to be programmed, application, to the second electrode of the first memory device, of a control signal that alternates at least once, during time period d, between a state 1 and a state 0, said control signal being similar when programming the first memory device in a high-resistance state or low-resistance state, wherein the states 0 and 1 of the data signal and of the control signal correspond to zero and positive electric potentials respectively, capable of forming the programming voltage when one of either the data signal or control signal is in state 0 and the other of either the data signal or control signal is in state 1, wherein the first memory device is electrically linked to a selection device such that the selection device allows a current to flow through the first memory device during a programming time included in time period d, and wherein a change from one of the states 0 and 1 of the control signal to the other of the states 0 and 1 of the control signal is included in the programming time.

It also describes a method for programming a first bipolar switching memory device comprising first and second electrodes at the terminals of which a programming voltage capable of programming the first memory device in a high-resistance or low-resistance state is intended to be applied, the method comprising at least the following steps:

application, to the first electrode of the first memory device, of a data signal having, during a time period d, a constant state 0 or 1, representative of the state in which the first memory device is intended to be programmed, application, to the second electrode of the first memory device, of a control signal having, during the time period d, a state 0, during a first part of the time period d and a state 1 during a second part of the time period d (or a state 1 during a first part of the time period d and a state 0 during a second part of the time period d), and wherein the states 0 and 1 of the data signal and of the control signal correspond to zero and positive electric potentials respectively, capable of forming the programming voltage when one of either the data signal or control signal is in state 0 and the other of either the data signal or control signal is in state 1.

One purpose of this invention is also to propose an electronic circuit comprising at least one bipolar switching memory device, for which the programming of the memory device does not require the use of negative electric potentials or complex routing and switching circuits to carry a data signal from both sides of the memory device.

For this purpose, this invention proposes an electronic circuit comprising a first bipolar switching memory device comprising first and second electrodes at the terminals of which a programming voltage capable of programming the first memory device in a high-resistance or low-resistance state is intended to be applied, the electronic circuit comprising at least:

first means capable of applying, to the first electrode of the first memory device, a data signal having, during a time period d, a constant state 0 or 1, representative of the state in which the first memory device is intended to be programmed, second means capable of applying, to the second electrode of the first memory device, a control signal that alternates at least once, during time period d, between a state 1 and a state 0, said control signal being similar when programming the first memory device in a high-resistance state or low-resistance state, wherein the states 0 and 1 of the data signal and of the control signal correspond to zero and positive electric potentials respectively, capable of forming the programming voltage when one of either the data signal or control signal is in state 0 and the other of either the data signal or control signal is in state 1, the electronic circuit further comprising a selection device electrically linked to the first memory device and capable of allowing a current to flow through the first memory device during a programming time included in time period d, and wherein the change from one of the states 0 or 1 of the control signal to the other of the states 0 or 1 of the control signal is intended to be controlled during the programming time.

The states 0 and 1 can be called low and high states respectively.

The control signal may be in state 1 during a first part of the time period d and be in state 0 during a second part of the time period d.

Due to the change in control signal state when programming the memory device, a suitable programming voltage is obtained at the terminals of the memory device, regardless of the state to be stored. Therefore, when the data signal to be stored is in state 1, storage in the memory device is triggered during the part of the time period d in which the control signal is in the state 0, for example during the second part of the time period d, and when the data signal to be stored is in the state 0, storage in the memory device is triggered during the part of the time period d in which the control signal is in state 1, for example during the first part of the time period d.

The stored state may correspond to that of the data signal or to the complementary state to that of the data signal, depending on the electrode, for example the active or inert electrode, to which the data signal is applied. The expressions "first part of the time period d" and "second part of the time period d" do not mean that the first part temporally precedes the second part, but describes the two different parts of the time period d, where the first part of the time period d can occur before or after the second part of the time period d. Therefore, during the time period d, the control signal can change from state 1 to state 0, or from state 0 to state 1. Furthermore, the sum of the first part of the time period d and the second part of the time period d can correspond to the total of the time period d, the control signal in this case undergoing a single change from a state 1 to a state 0 (or from a state 0 to a state 1) during the time period d.

Alternatively, the sum of the first part of the time period d and the second part of the time period d can correspond to only one portion of the time period d, for example in the event that the control signal alternates several times between the states 1 and 0 during the time period d.

Given that the flow of current through the memory device is only allowed by the selection device during a programming time which is included in the time period d, the value of the data signal is therefore stable throughout the programming time of the memory device, thus guaranteeing good stability when programming the memory device. Furthermore, because the control signal applied to the second electrode of the memory device is the same when programming the memory device in a high-resistance state or low-resistance state, the management of the control signal is simplified compared to that of a control signal whose value must be adapted depending on the state in which a memory device must be programmed.

Moreover, because the control signal applied to the second electrode of the memory device is the same when programming the memory device in a high-resistance state or low-resistance state and because the change from state 0 to state 1, or from state 1 to state 0, of the control signal takes place during the programming time (time during which the value of the data signal does not change), a single value alternation of the control signal state suffices throughout the programming time to program the memory device in the desired state. This prevents the need to reset the device memory state before programming to the desired value, and therefore prevents an unnecessary aging of the memory device due to a systematic reset of the memory device state before each programming operation.

Advantageously, the invention applies for memory applications, or in logic circuits, the production technology of which is compatible and can be easily inserted into CMOS methods. According to the invention, the programming method and electronic circuit may advantageously be used to program memory devices of logic circuits such as programmable interconnections, non-volatile look-up tables or even non-volatile switching matrices.

The first memory device may be a CBRAM or RRAM-type device (for example OxReRAM-type device), the first and second electrodes respectively corresponding to an active electrode and an inert electrode of the first memory device, or vice-versa.

The first part of the time period d may correspond to a substantial time period equal to that of the second part of the time period d. In this case, the control signal can correspond to a symmetrical signal, as the duration of state 0 of the control signal is substantially equal to that of state 1 of the control signal during the time period d. However, the control signal may also be asymmetrical; in this case, a first part of the time period d corresponds to a time that is greater or less than that of the second part of the time period d.

During the time period d, the control signal may alternate multiple times between states 1 and 0, i.e. multiple changes from one of these states to the other.

One of the first and second electrodes may be electrically linked to the source or to the drain of at least one first selection MOS transistor, and, during at least one part of the time period d, the selection MOS transistor may be in the ON state. The first selection MOS transistor may form part of the selection device and be intended to be in the ON state throughout the programming time. Aside from the selection role of the memory device, the state of which is intended to be programmed, such an MOS transistor is also used to limit the current flowing through the memory device during its programming, and therefore helps adapt this current to suit the nature of the memory device.

The second electrode may be electrically linked to a first electrically conductive line to which the control signal is applied, and the first electrode may be electrically linked to a second electrically conductive line to which the data signal is applied. The second means may include a first electrically conductive line electrically linked to the second electrode, and the first means may include a second electrically conductive line electrically linked to the first electrode.

The second electrode of the first memory device may be electrically linked to one of a first electrode and second electrode of a second memory device, capable of being programmed in a complementary state to that in which the first memory device is programmed, a second data signal capable of being applied to the other of the first electrode and second electrode of the second memory device. Furthermore, the electronic circuit may comprise a second memory device capable of being programmed in a complementary state to that in which the first memory device is intended to be programmed, the second electrode of the first memory device may be electrically linked to one of a first electrode and second electrode of the second memory device, and the electronic circuit may further comprise third means capable of applying a second data signal to the other of the first electrode and second electrode of the second memory device.

The expression "complementary state" describes either the high-resistance state, which is therefore complementary to the low-resistance state, or the low-resistance state, which is therefore complementary to the high-resistance state.

In this case, the second electrode of the first memory device may be electrically linked to a gate of a second MOS transistor, an ON or OFF state of which can depend on the states in which the first memory device and the second memory device are programmed, and which form a voltage divider bridge. The electronic circuit may further comprise a second MOS transistor, an ON or OFF state of which depends on the complementary states in which the first memory device and the second memory device are intended to be programmed, and which form a voltage divider bridge, and in which the second electrode of the first memory device is electrically linked to a gate of the second MOS transistor.

The first memory device and the second memory device may form a memory cell, an output of which is electrically linked to the second electrode of the first memory device, the output of the memory cell capable of being electrically linked to one of the data inputs of a multiplexer. The electronic circuit may comprise such a multiplexer.

The invention also concerns a method for programming a programmable interconnection system capable of carrying at least one signal intended to be applied to one of a plurality of inputs of the programmable interconnection system towards at least one of a plurality of outputs of the programmable interconnection system, comprising a plurality of bipolar switching memory devices, the programming states of which determine the interconnection states between the inputs and outputs of the programmable interconnection system, wherein the memory devices are programmed by the implementation of a programming method as described hereinabove.

The invention also concerns a programmable interconnection system capable of carrying at least one signal intended to be applied to one of a plurality of inputs of the programmable interconnection system towards at least one of a plurality of outputs of the programmable interconnection system, comprising a plurality of electronic circuits as described hereinabove, the electronic circuits comprising bipolar switching memory devices, the programming states of which determine the interconnection states between the inputs and outputs of the programmable interconnection system.

The invention also relates to a method for programming a latch device for a retention flip-flop, the latch device comprising at least two bipolar switching memory devices, each programmed by the implementation of a programming method according to one of claims 1 to 6, wherein the second electrode of the first memory device is electrically linked to one of the first and second electrodes of the second memory device such that the same control signal is applied to the second electrode of the first memory device and to said one of the first and second electrodes of the second memory device, the first electrode of the first memory device being electrically linked to the output of a first CMOS inverter via a first MOS transistor, and the other of the first and second electrodes of the second memory device being electrically linked to the output of a second CMOS inverter via a second MOS transistor.

The invention also relates to a latch device for a retention flip-flop, comprising at least two electronic circuits as described hereinabove, wherein the second electrode of the memory device of a first of the two electronic circuits is electrically linked to one of the first and second electrodes of the memory device of a second of the two electronic circuits, such that the same control signal is applied to the second electrode of the memory device of the first electronic circuit and to said one of the first and second electrodes of the memory device of the second electronic circuit, the first electrode of the memory device of the first electronic circuit being electrically linked to the output of a first CMOS inverter via a first MOS transistor, and the other of the first and second electrodes of the memory device of the second electronic circuit being electrically linked to the output of a second CMOS inverter via a second MOS transistor.

The invention also relates to a method for programming a differential memory cell comprising at least two bipolar switching memory devices, each programmed by the implementation of a programming method as described hereinabove, wherein the second electrode of the first memory device is electrically linked to one of the first and second electrodes of the second memory device capable of being programmed in a complementary state to that in which the first memory device is programmed, a second data signal inverse to that applied to the first electrode of the first memory device being applied to the other of the first and second electrodes of the second memory device.

The invention also relates to a differential memory cell, comprising at least two electronic circuits as described hereinabove, wherein the second electrode of the memory device of a first of the two electronic circuits is electrically linked to one of the first and second electrodes of the memory device of a second of the two electronic circuits, capable of being programmed in a complementary state to that in which the memory device of the first electronic circuit is programmed, a second data signal inverse to that applied to the first electrode of the memory device of the first electronic circuit being applied to the other of the first and second electrodes of the memory device of the second electronic circuit.

BRIEF DESCRIPTION OF THE FIGURES

This invention will be better understood after reading the following description of embodiments, which is intended for purposes of illustration only and is not intended to limit the scope of the invention, and with reference to the accompanying figures, wherein.

Identical, similar or equivalent parts of the different figures described hereinbelow carry the same numerical references in order to ease the passage from one figure to another.

The different parts shown in the figures are not necessarily displayed according to a uniform scale in order to make the figures easier to read.

The different possibilities (alternatives and embodiments) must be understood as not being exclusive with regard to each other and can be combined together.

DETAILED DESCRIPTION OF THE SPECIFIC EMBODIMENTS

Figure 1:
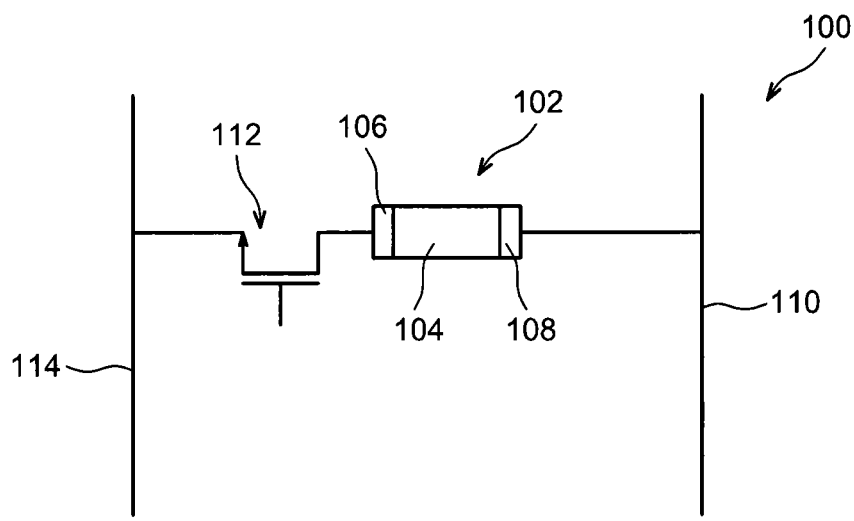
FIG. 1 shows an electronic circuit according to a first embodiment of the invention, comprising a bipolar switching non-volatile memory device intended to be programmed by implementing a programming method also according to the invention.

Referring firstly to FIG. 1, which shows an electronic circuit 100 according to a first embodiment, comprising a bipolar switching non-volatile memory device 102 intended to be programmed by implementing an example of the programming method.

In the embodiment described here, the memory device 102 is a ReRAM-type device and comprises a resistive-type solid electrolyte 104 placed between an active electrode 106 and an inert electrode 108. The active electrode 106 and the inert electrode 108 form the terminals of the memory device 102 to which a programming voltage for the memory device 102 is intended to be applied.

The inert electrode 108 is electrically linked to a first electrically conductive line 110 to which a control signal ("WRITE") is intended to be applied. The active electrode 106 is electrically linked to the drain of an MOS-type transistor 112, corresponding to a selection transistor for the memory device 102. In the embodiment described here, the transistor 112 is an NMOS-type transistor. In an alternative embodiment, the transistor 112 could be a PMOS-type transistor, or be replaced by a CMOS gate comprising an NMOS transistor linked in parallel to a PMOS transistor. The source of the transistor 112 is electrically linked to a second electrically conductive line 114 to which a data signal ("DATA") is intended to be applied. A selection signal ("SEL") is intended to be applied to the gate of the transistor 112 (the selection signal is adapted according to whether an NMOS or a PMOS-type transistor 112 is used, or corresponds to a CMOS gate). The selection transistor 112 is used to electrically link the active electrode 106 of the memory device 102 to the second electrically conductive line 114 when the memory device 102 must be programmed. Moreover, when the selection transistor 112 is ON, it is also used to impose a limit on the current flowing through the memory device 102. Therefore, the second electrically conductive line 114 corresponds to first means capable of applying the data signal to the active electrode 106 of the memory device 102, and the first electrically conductive line 110 forms second means capable of applying the control signal to the inert electrode 108 of the memory device 102.

The DATA, SEL and WRITE signals correspond in this example to electric potentials capable of assuming two values respectively corresponding to states 0 and 1. The values of the electric potentials corresponding to the binary states 0 and 1 of the DATA and WRITE signals in particular depend on the characteristics and technology used to produce the memory device 102. The electric potentials corresponding to the same state 0 or 1 are similar or substantially similar for the two DATA and WRITE signals. In the example described here, the state 0 of the DATA and WRITE signals corresponds, for example, to a zero electric potential, whereas the state 1 of these signals corresponds, for example, to a positive electric potential, the value of which depends on the materials used: for an OxReRAM-type memory device comprising hafnium oxide, the programming voltage is, for example, equal to approximately 0.5 V (value varying according to the thickness of the hafnium oxide), whereas for a CBRAM-type memory device, the programming voltage may be between approximately 0.2 V and 1.5 V. Similarly, the values of the electric potentials respectively corresponding to the binary states 0 and 1 of the SEL signal in particular depend on the characteristics and technology used to produce the transistor 112. In the example described here, the programming voltage of the memory device 102, i.e. the difference of potentials applied to the terminals of the memory device 102, is equal to approximately 0.5 V.

In the example described here, the state 0 of the SEL signal corresponds, for example, to a zero electric potential, whereas the state 1 of this signal corresponds, for example, to an electric potential greater than the threshold voltage of the transistor in order for the latter to be conductive.

The memory state programmed in the memory device 102 is known as MEM and corresponds either to a high resistance state HRS, known as a high state and shown on the chronograms as a binary value equal to 1, and a low resistance state LRS, known as a low state and shown on the chronograms as a binary value equal to 0. Therefore, the memory device 102 is programmed in the low state when the DATA signal is in state 1 and the WRITE signal is in state 0, and the memory device 102 is programmed in the high state when the DATA signal is in state 0 and the WRITE signal is in state 1.

Although not shown, the electronic circuit 100 comprises other memory devices including their terminals electrically connected to the first electrically conductive line 110 and to the second electrically conductive line 114 via a selection transistor for example similar to the transistor 112. The programming therefore takes place in the memory devices for which the selection transistor is in the ON state.

This document shall now describe, in relation to the chronogram shown in FIG. 2, a method for programming the memory device 102 of the electronic circuit 100 described hereinabove in the low state, which can be assimilated to the storage of a binary value 0 in the memory device 102 of the electronic circuit 100.

When programming the memory device 102, with regard to both low state and high state programming, the SEL signal changes to state 1 so that the selection transistor 112 is in the ON state and the active electrode 106 becomes electrically linked to the second electrically conductive line 114.

Figure 2:
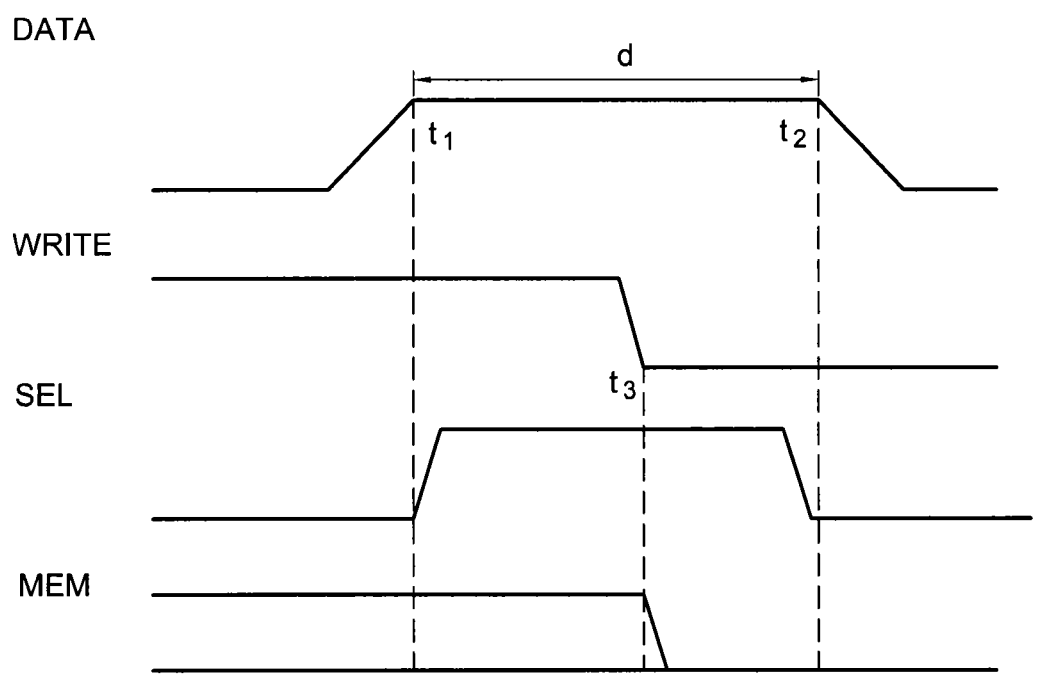
FIGS. 2 and 3 are chronograms for a memory device according to the first embodiment, obtained on implementing a programming method according to the invention.

The data signal DATA, which represents the data item to be stored by the memory device 102, changes to state 1 during a time period d, corresponding to a time period between a first time $t_1$ and a second time $t_2$ (therefore where $d=t_2-t_1$) in the example in FIG. 2. The SEL signal changes to state 1 during this time period d in order to prevent any programming of the memory device 102 in a state other than that desired, outside of this time period d. FIG. 2 therefore shows that at times $t_1$ and $t_2$, the SEL signal is in state 0, and changes to state 1 just after $t_1$ and changes back to state 0 just before $t_2$. The SEL signal is therefore activated once the DATA signal is stabilised at the value representing the data item to be stored. The time period during which the SEL signal is in state 1, which corresponds to the time period during which a current can flow through the memory device 102, is known as the programming time, this programming time being included in the time period d.

Moreover, during this time period d, between times $t_1$ and $t_2$, the control signal WRITE changes from state 1 to state 0. A time $t_3$, included between $t_1$ and $t_2$, corresponds to the time at which the control signal WRITE changes from state 1 to state 0.

Therefore, during a first part of the time period d ranging from $t_1$ to approximately $t_3$ (approximately as the change from state 1 to state 0 of the WRITE signal is not instant), signals in state 1 are applied to each of the two electrodes 106 and 108 of the memory device 102. The same electric potential is therefore applied to each of the terminals of the memory device 102, which is equivalent to the application of a zero voltage at the terminals of the memory device 102. An initial memory state MEM of the memory device 102 does not therefore change during this first part of the time period d and remains in the low or high state according to the initial memory state of the memory device 102.

From time $t_3$, the control signal WRITE is in state 0. Due to the fact that the data signal DATA is always in state 1, the memory device 102 therefore receives a voltage of approximately 0.5 V at its terminals, i.e. a positive electric potential of 0.5 V applied to the active electrode 106 and a zero electric potential applied to the inert electrode 108. The memory state MEM of the memory device 102 therefore changes to the low state at time $t_3$ if the initial memory state corresponds to the high state, or stays in the low state if this corresponds to the initial memory state.

From time $t_2$, the data signal DATA changes back to state 0. Due to the fact that the control signal WRITE is always in state 0, the same electric potential is therefore applied to the two terminals 106, 108 of the memory device 102, which is equivalent to the application of no voltage (or a zero voltage) at the terminals of the memory device 102. The memory state MEM of the memory device 102 therefore does not change and stays in the low state. The SEL signal changes back to 0 before the data signal DATA and/or the control signal WRITE change value and are able to modify the memory state MEM of the memory device 102.

The SEL signal can be changed to state 0 as soon as the desired information is stored in the memory device 102, i.e. in this case during the second part of the time period d ranging from $t_3$ to $t_2$. In this case, the SEL signal can change from state 1 to state 0 after $t_2$, provided that the DATA and WRITE signals both remain in state 0 after $t_2$ so as not to modify the programming state of the memory device 102. However, the SEL signal preferably changes back to state 0 when the DATA signal is still in its stabilised state.

In the example described hereinabove in relation to FIG. 2, the storage of the low state in the memory device 102 is triggered by the change of the control signal WRITE from state 1 to state 0.

Figure 3:
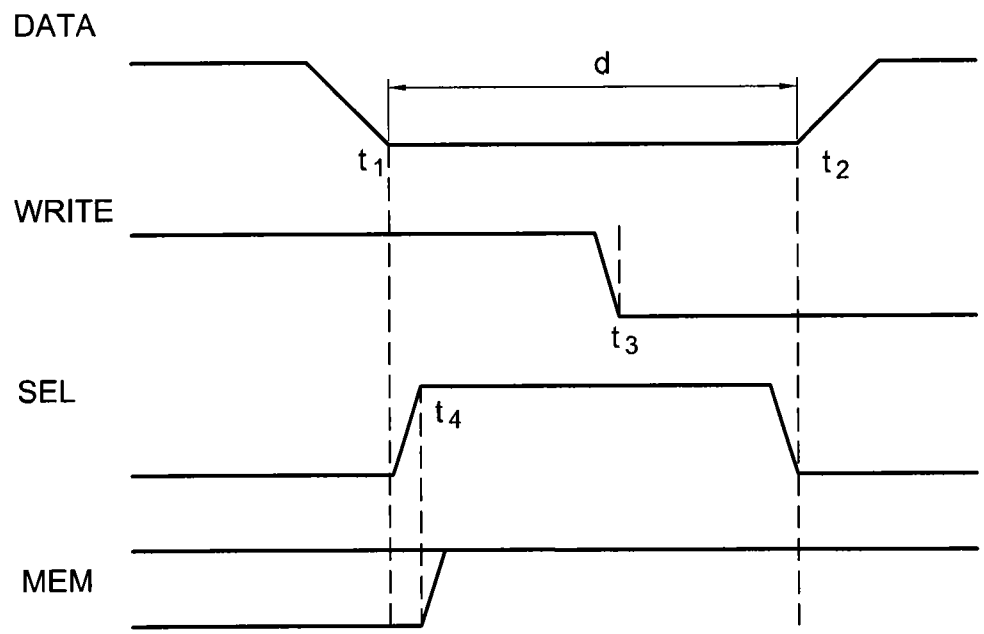

This document shall now describe, in relation to the chronogram shown in FIG. 3, a method for programming the memory device 102 in the high state, which can be assimilated to the storage of a binary value 1 in the memory device 102.

The data signal DATA changes to state 0 for a time period d, corresponding to $t_2-t_1$ in the example provided in FIG. 3. The SEL signal changes to state 1 from $t_1$ so that the transistor 112 is in the ON state and the active electrode 106 becomes electrically linked to the second electrically conductive line 114. The SEL signal is therefore in state 1 at a time $t_4$, a little after $t_1$.

At time $t_4$, the data signal DATA is already stabilised in state 0. Due to the fact that the control signal WRITE is in state 1 at time $t_4$, the memory device 102 therefore receives a voltage equivalent to −0.5 V at its terminals, formed in this case by a positive electric potential of 0.5 V applied to the inert electrode 108 and a zero electric potential applied to the active electrode 106. The memory state MEM of the memory device 102 therefore changes to the high state at time $t_4$ or stays in the high state if this corresponds to the initial memory state.

At time $t_3$, included between $t_1$ and $t_2$, the control signal WRITE changes from state 1 to state 0.

This state change does not affect the state stored in the memory device 102, as during the second part of the time period d ranging from $t_3$ to $t_2$, a signal in state 0 is applied to each of the two electrodes 106 and 108 of the memory device 102. The same electric potential is therefore applied to each of the two terminals 106, 108 of the memory device 102, which is equivalent to the application of no voltage or a zero voltage at the terminals of the memory device 102. The memory state MEM of the memory device 102 therefore does not change and stays in the high state during this second part of the time period d.

The SEL signal changes back to state 0 before the data signal DATA changes back to state 1 to prevent the memory state MEM stored from changing back to the low state.

In the example described hereinabove in relation to FIG. 3, the storage of the high state in the memory device 102 is triggered by the change of the signal DATA from state 1 to state 0, and the change of the SEL signal to state 1.

In the example of the circuit 100 described hereinabove, the DATA signal is seen to be stored such that a state 0 of this signal is stored in the form of a high state of the memory device 102, and a state 1 of the DATA signal is seen to be stored in the form of a low state of the memory device 102.

Furthermore, as shown in FIGS. 2 and 3, the control signal WRITE used to program the memory device 102 in the low state is the same as that used to program the memory device 102 in the high state. This control signal WRITE therefore does not need to be adapted to suit the state in which the memory device 102 is intended to be programmed.

Alternatively, the data signal DATA can be applied to the first electrically conductive line 110 and the control signal WRITE can be applied to the second electrically conductive line 114. This is equivalent to reversing the layout of the memory device 102 in relation to the configuration shown in FIG. 1, i.e. in electrically linking the inert electrode 108 to the drain of the selection transistor 112 and in electrically linking the active electrode 106 to the first transmission line 110. In this alternative, the memory state MEM stored in the memory device 102 is such that the memory device 102 is in the high state when the data signal DATA stored is in state 1, and is in the low state when the data signal DATA stored is in state 0.

With regard to the configuration shown in FIG. 1, it is possible that the selection transistor 112 is not interposed between the active electrode 106 and the second transmission line 114, but instead between the inert electrode 108 and the first electrically conductive line 110, or that the source of the transistor 112 is electrically linked to one of the terminals of the memory device 102, or even that the electronic circuit 100 does not comprise this selection transistor 112.

In the programming method described hereinabove, a memory state is written in the memory device 102 due to the fact that during the time period d, the control signal WRITE changes from state 1 to state 0. Alternatively, when programming the memory device 102, i.e. during the time period d, the control signal WRITE can change from state 0 to state 1. Indeed, the programming method described here enables the memory device 102 to be programmed in either of the two high or low states due to the fact that during the time period d for programming the memory device 102 in which the data signal DATA is in the state that is to be stored (or in the inverse state to that which will be stored), the control signal WRITE passes through the two states 1 and 0, regardless of the order in which these two states are reached by the WRITE signal. In this case, the control signal WRITE used to program the memory device 102 in the low state is also the same as that used to program the memory device 102 in the high state.

In the programming examples described hereinabove, during the time period d, the WRITE signal only changes state once. However, during the time period d, the WRITE signal can also change multiple times from state 1 to state 0 and vice-versa.

In the programming method described hereinabove, during the period in which the data signal DATA is in the state that is to be stored (i.e. during period $t_2$–$t_1$), the control signal WRITE is in state 1 for a first part of the time period d approximately corresponding to half of this time period d, and is in state 0 for a second part of the time period d approximately corresponding to half of this time period d (in other words, the state change of the control signal WRITE takes place approximately halfway through this time period d). Alternatively, the part of the time period d during which the control signal WRITE is in state 0 can be shorter or longer than the part of the time period d during which the control signal WRITE is in state 1, during the programming phase of the memory device 102. These durations can in particular be adjusted according to the characteristics of the memory device 102 which are not always symmetrical, as described by the example in the document entitled "Conductive bridging RAM (CBRAM): an emerging non-volatile memory technology scalable to sub 20 nm" by M. Kund et al., Electron Devices Meeting, 2005. IEDM Technical Digest. IEEE International, pages 754-757.

Figure 4:
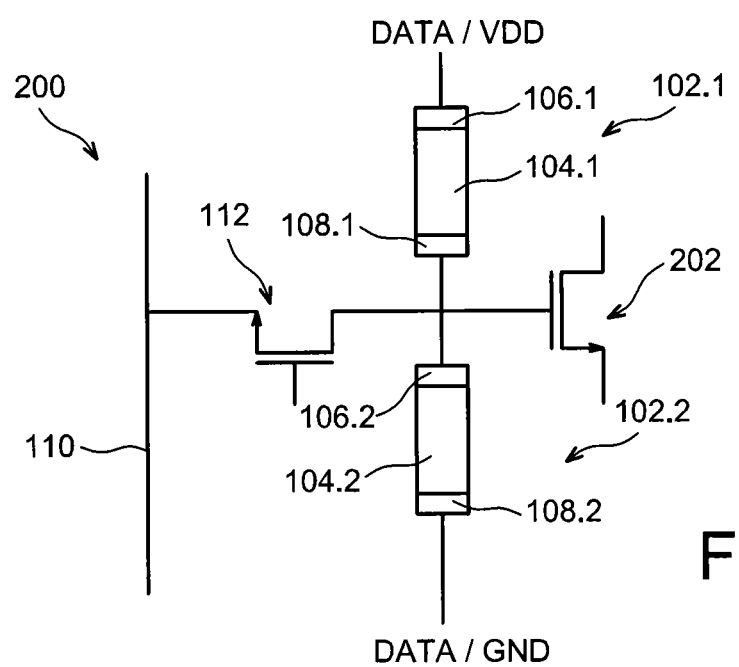
FIG. 4 shows an electronic circuit according to a second embodiment of the invention, comprising two bipolar switching non-volatile memory devices intended to be programmed in a complementary manner by implementing a programming method also according to the invention.

FIG. 4 shows an electronic circuit 200 according to a second embodiment comprising two bipolar switching non-volatile memory devices 102.1 and 102.2 similar to the memory device 102 described hereinabove and intended to be programmed in a complementary manner (i.e. in two different states) via the programming method described hereinabove.

The electronic circuit 200 comprises a first electrically conductive line 110 electrically linked to the drain of a selection transistor 112.

The source of the selection transistor 112 is electrically linked to the inert electrode 108.1 of the first memory device 102.1 and to the active electrode 106.2 of the second memory device 102.2. The control signal WRITE similar to that described hereinabove with regard to the first electronic circuit 100 is applied to the first electrically conductive line 110. The SEL signal, also similar to that described hereinabove, is applied to the gate of the selection transistor 112. A first data signal DATA/Vdd is applied to the active electrode 106.1 of the first memory device 102.1 via means not shown in FIG. 4, and a second data signal DATA/Gnd is applied to the inert electrode 108.2 of the second memory device 102.2.

The source of the selection transistor 112 as well as the inert electrode 108.1 of the first memory device 102.1 and the active electrode 106.2 of the second memory device 102.2 are electrically linked to the gate of a second transistor 202, the ON or OFF state of which is intended to be controlled according to the value of the states stored in the memory devices 102.1 and 102.2.

When the electronic circuit 200 is in "programming" mode, i.e. when the states stored by the memory devices 102.1 and 102.2 are programmed, the first data signal DATA/Vdd therefore takes on a value similar to that of the second data signal DATA/Gnd. When the electronic circuit 200 is in "control" mode, i.e. when the memory devices 102.1 and 102.2 are used to control the change to the ON or OFF state of the second transistor 202, the first data signal DATA/Vdd is in state 1 (corresponding to the electric potential Vdd) and the second data signal DATA/Gnd is in state 0 (corresponding to a zero electric potential).

Figure 5:
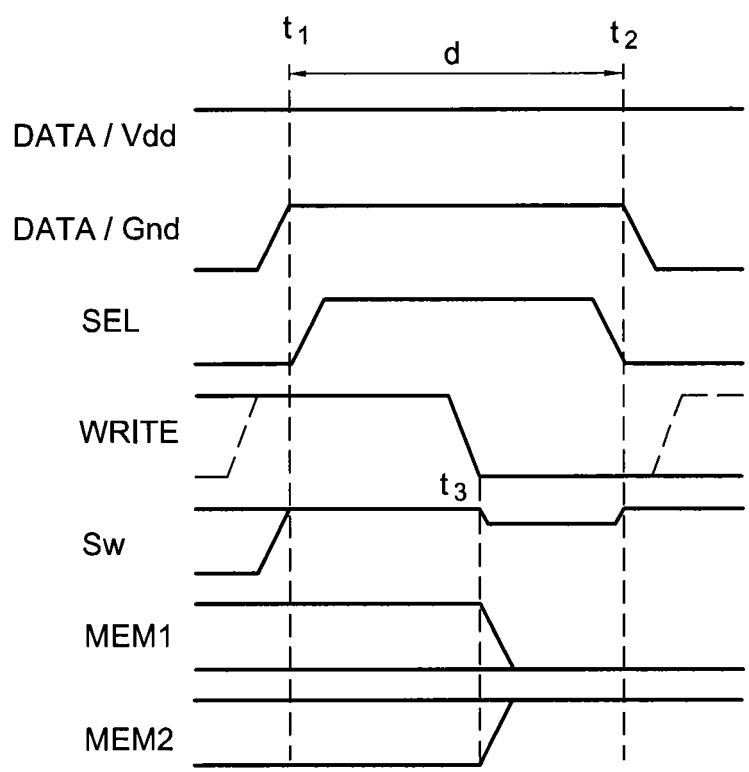
FIGS. 5 and 6 are chronograms for an electronic circuit according to the second embodiment of the invention, obtained on implementing a programming method for two memory devices, also subject to this invention.

This document shall now describe, in relation to the chronogram shown in FIG. 5, a method for programming the first memory device 102.1 in the low state and the second memory device 102.2 in the high state.

Given that the first data signal DADA/Vdd is by default (in "control" mode) in state 1, it is left in state 1 throughout the duration of the "programming" mode when the first memory device 102.1 is intended to be programmed in the low state and when the second memory device 102.2 is intended to be programmed in the high state. However, as the second data signal DATA/Gnd is by default (in "control" mode) in state 0, this changes to state 1 for the programming time d, corresponding to $t_2$-$t_1$, of the circuit 200.

As described hereinabove, the SEL signal changes to state 1 during this time period d so that the transistor 112 is ON and so that the inert electrode 108.1 of the first memory device 102.1 and the active electrode 106.2 of the second memory device 102.2 are electrically linked to the first electrically conductive line 110 and subject to the electric potential of the control signal WRITE during the programming phase for these devices. As shown in this figure, the programming time for the memory devices 102.1 and 102.2 corresponding to the time during which the SEL signal is in state 1, is therefore included in the time period d. Moreover, during this time period d, the control signal WRITE changes from state 1 to state 0. The time $t_3$, included between $t_1$ and $t_2$, corresponds to the time from which the control signal WRITE is in state 0.

Therefore, during the part of the time period d ranging from the change of the SEL signal to state 1 until $t_3$, a signal in state 1 is applied to each of the two electrodes of each of the memory devices 102.1 and 102.2. The same electric potential is therefore applied to the two terminals 106, 108 of each of the memory devices 102.1 and 102.2, which is equivalent to the application of no voltage or a zero voltage at the terminals of the memory devices 102.1 and 102.2. The memory state MEM1 of the first memory device 102.1 and the memory state MEM2 of the second memory device 102.2 therefore do not change and stay in their initial respective states for this part of the time period d.

From time $t_3$, the control signal WRITE is in state 0. Due to the fact that the data signals DATA/Vdd and DATA/Gnd are always in state 1, the first memory device 102.1 therefore receives a voltage of 0.5 V at its terminals, i.e. a positive electric potential of 0.5 V applied to its active electrode 106.1 and a zero electric potential applied to its inert electrode 108.1. The memory state MEM1 of the first memory device 102.1 therefore changes to the low state at time $t_3$ if the initial memory state corresponds to the high state, or stays in the low state if this corresponds to the initial memory state MEM1.

In parallel, the second memory device 102.2 receives a voltage equivalent to −0.5 V at its terminals, i.e. a positive electric potential of 0.5 V applied to its inert electrode 108.2 and a zero electric potential applied to its active electrode 106.2. The memory state MEM2 of the second memory device 102.2 therefore changes to the high state at time $t_3$ if the initial memory state corresponds to the low state, or stays in the high state if this corresponds to the initial memory state MEM2.

From time $t_2$, the electronic circuit 200 exits the "programming" mode and returns to the "control" mode. The first data signal DATA/Vdd stays in state 1 and the second data signal DATA/Gnd changes back to state 0. The SEL signal changes back to state 0 before the data signal DATA/Gnd and/or the control signal WRITE change value and modify the states stored in the memory devices 102.1 and 102.2. The SEL signal therefore changes back to state 0 between times $t_3$ and $t_2$.

As described hereinabove with regard to FIG. 2, the programming of the memory devices 102.1 and 102.2 is triggered by the change of the control signal WRITE from state 1 to state 0 during the time period d.

After time $t_2$, the electronic circuit 200 is in "control" mode. The transistor 202 is thus controlled via the states stored in the memory devices 102.1 and 102.2. Indeed, the two memory devices 102.1 and 102.2 are in this case equivalent to two electrical resistances, the values of which depend on the state stored and form a voltage divider bridge. The ratio of electrical resistance values between a memory device in the high state (high resistance) and a memory device in the low state (low resistance) is greater than 10 or greater than 100. In the example described with regard to FIG. 5, given that the first memory device 102.1 is in the low state and the second memory device is in the high state, the voltage applied to the gate of the transistor 202 is therefore sufficient, and has a value close to that of Vdd taking into account the low resistance of the first memory device 102.1 and the high resistance of the second memory device 102.2, in order to change the transistor 202 to ON (represented by the Sw signal in state 1 in FIG. 5). FIG. 5 shows that the Sw signal can have three different values:

During the time period d, if the WRITE and DATA signals have the same value, the Sw signal therefore follows this value.

During the time period d, if the WRITE and DATA signals have opposite values (write), the Sw signal has an intermediate value, set by the ratio of the currents flowing through the selection transistor 112 and the two resistances formed by the memory devices 102.1 and 102.2, and the voltages of the WRITE, DATA/VDD and DATA/GND signals.

After the time period d, the Sw signal takes on a value 1 or 0, depending on the value programmed in the resistances.

Figure 6:
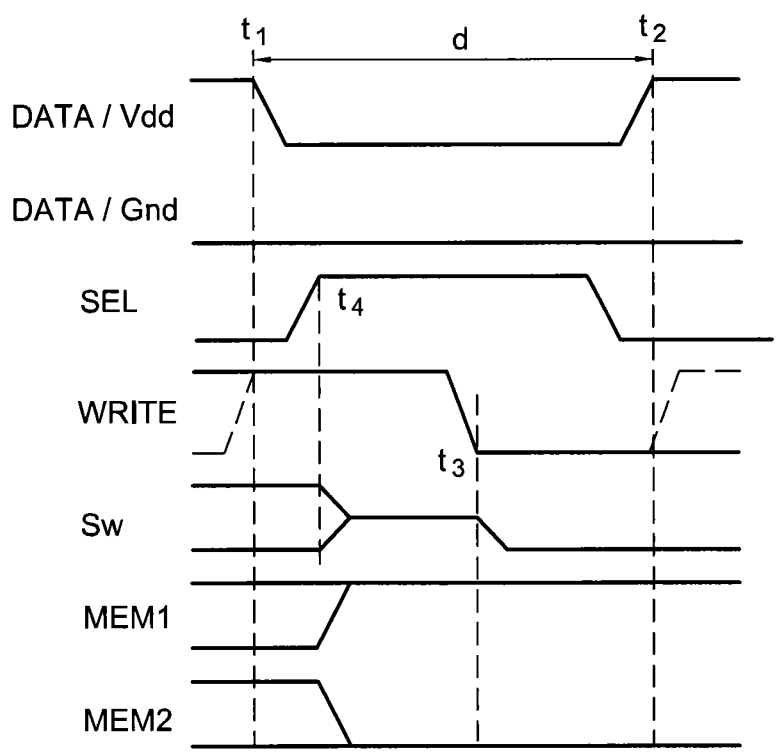

This document shall now describe, in relation to the chronogram shown in FIG. 6, a method for programming the first memory device 102.1 to the high state and the second memory device 102.2 to the low state.

Given that the second data signal DADA/Gnd is by default (in "control" mode) in state 0, it is left in state 0 throughout the programming time when the first memory device 102.1 is intended to be programmed in the high state and when the second memory device 102.2 is intended to be programmed in the low state. However, as the first data signal DATA/Vdd is by default in state 1, this changes to state 0 for the programming time d. During this time period d, the SEL signal changes to state 1 so that the transistor 112 is ON and so that the inert electrode 108.1 of the first memory device 102.1 and the active electrode 106.2 of the second memory device 102.2 are electrically linked to the first electrically conductive line 110.

A little after time t₁, the SEL signal is in state 1 (at time t₄). Due to the fact that the control signal WRITE is in state 1, the first memory device 102.1 therefore receives a voltage equivalent to −0.5 V at its terminals from time t₄, formed by a positive electric potential of 0.5 V applied to the inert electrode 108.1 and a zero electric potential applied to the active electrode 106.1. The memory state MEM1 of the first memory device 102.1 changes to or stays in the high state at time t₄. The second memory device 102.2 receives a voltage of 0.5 V at its terminals (a positive electric potential of 0.5 V applied to the active electrode 106.2 and a zero electric potential applied to the inert electrode 108.2). The memory state MEM2 of the second memory device 102.2 changes to or stays in the low state at time t₄.

At time t₃, included between t₁ and t₂, the control signal WRITE changes from state 1 to state 0. This state change does not affect the states stored in the memory devices 102.1 and 102.2 (equivalent to the application of a substantially zero voltage to the terminals of each of the memory devices 102.1 and 102.2). The SEL signal then changes back to state 0 before the data signal DATA changes back to state 1, i.e. before t₂.

In the example described hereinabove, the storage of the high state in the first memory device 102.1 and of the low state in the second memory device 102.2 is triggered by the change of the data signal DATA from state 1 to state 0, and the change of the SEL signal to state 1.

As shown in FIGS. 5 and 6, the control signal WRITE used to program the first memory device 102.1 in the low state and the second memory device 102.2 in the high state is the same as that used to program the first memory device 102.1 in the high state and the second memory device 102.2 in the low state.

After t₂, the electronic circuit 200 is in "control" mode. The transistor 202 is thus controlled by the states stored in the memory devices 102.1 and 102.2. In the example described with regard to FIG. 6, given that the first memory device 102.1 is in the high state and the second memory device is in the low state, the voltage applied to the gate of the transistor 202 is therefore close to a zero voltage, changing the transistor 202 to OFF (represented by the Sw signal in state 0 in FIG. 6).

In the electronic circuit 200 described hereinabove, the time period required for one of the memory devices 102.1 or 102.2 to change from the high state to the low state is less than the time period required for the other memory device to change from the low state to the high state (in FIGS. 5 and 6, these time periods are represented as being equivalent for simplification purposes). Therefore, this prevents the electronic circuit 200 from being in an unwanted transitory state wherein the two memory devices 102.1 and 102.2 are simultaneously in the low state.

Alternatively, the wiring of the electronic circuit 200 can be modified such that the active electrode 106.1 of the first memory device 102.1 and the inert electrode 108.2 of the second memory device 102.2 are electrically linked to the source of the selection transistor 112, and such that the DATA/Vdd and DATA/Gnd signals are intended to be applied to the inert electrode 108.1 of the first memory device 102.1 and to the active electrode 106.2 of the second memory device 102.2 respectively. In this case, for the same DATA/Vdd, DATA/Gnd, SEL and WRITE signals as those described hereinabove with regard to FIGS. 5 and 6, the states stored in the memory devices 102.1 and 102.2 are reversed in relation to those described hereinabove with regard to these figures.

Alternatively, during the programming phase for the memory devices 102.1 and 102.2, i.e. during the time period d, the control signal WRITE can also change from state 0 to state 1. The part of the time period d during which the control signal WRITE is in state 0 can also be shorter or longer than that during which the control signal WRITE is in state 1.

In another alternative embodiment, the two inert electrodes 108.1 and 108.2 (or the two active electrodes 106.1 and 106.2) of the two memory devices 102.1 and 102.2 can be electrically linked to the source of the transistor 112. In this case, when the circuit 200 is in programming mode, the first data signal DATA/Vdd applied to the active electrode 106.1 (or the inert electrode 108.1) of the first memory device 102.1 has the inverse value to the second data signal DATA/Gnd applied to the active electrode 106.2 (the inert electrode 108.2) of the second memory device 102.2.

Figure 7:
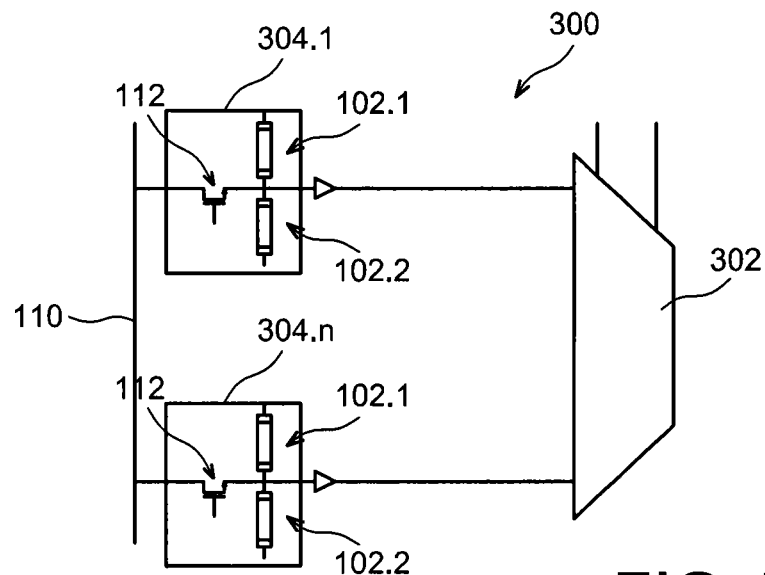
FIG. 7 shows an electronic circuit according to a third embodiment of the invention, comprising multiple bipolar switching non-volatile memory devices intended to be programmed in a complementary manner and in twos, by implementing a programming method also according to the invention.

FIG. 7 shows another electronic circuit 300 according to a third embodiment, using bipolar non-volatile memory devices programmed in twos in a complementary manner to that described hereinabove for the electronic circuit 200. The electronic circuit 300 is in this case an FPGA-type look-up table (LUT) comprising an n-bit multiplexer 302, where n is an integer greater than 1. Each of the n inputs of the multiplexer 302 is linked to one of the memory elements 304.1 to 304.n, each formed from two memory devices 102.1 and 102.2, similar to those described hereinabove, programmed in a complementary manner, and from a selection transistor 112. Therefore, the multiplexer 302 can produce at its output the values stored in the memory elements 304.1 to 304.n, and therefore in the memory devices 102.1 and 102.2 of these memory elements, according to the control signals or address signals, applied to the input of the multiplexer 302.

Figure 8:
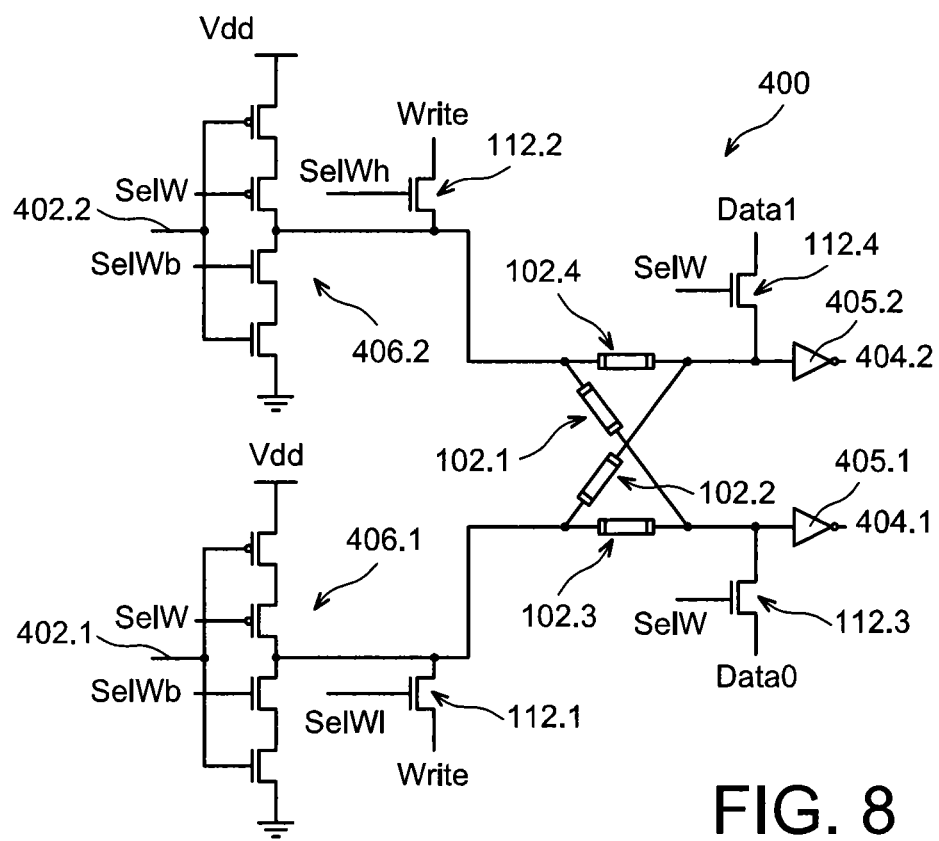
FIG. 8 shows an electronic circuit according to a fourth embodiment of the invention, comprising multiple bipolar switching non-volatile memory devices intended to be programmed by implementing a programming method also according to the invention.

FIG. 8 shows another electronic circuit 400 according to a fourth embodiment corresponding to a programmable interconnection system. This circuit 400 in particular comprises two inputs 402.1, 402.2, two outputs 404.1, 404.2 corresponding to the outputs of two inverters 405.1 and 405.2, and four bipolar non-volatile memory devices 102.1 to 102.4. The circuit 400 is capable of producing on one and/or the other of the two outputs 404.1, 404.2 the signal values applied to one and/or the other of the two inputs 402.1, 402.2 according to the high state or low state of each of the four memory devices 102.1-102.4.

The states 0 and 1 that can be taken by the outputs 404.1 and 404.2 can respectively correspond to a zero reference voltage and a voltage $V_{DD}$ for example equal to 0.5 V.

The programming of each of the four memory devices 102.1-102.4 takes place in a manner similar to that described hereinabove with regard to FIGS. 1 to 3. The control signal WRITE is intended to be applied to the inert electrodes of the first and second memory devices 102.1 and 102.2 when a first selection transistor 112.1 is ON, the ON or OFF state of this first selection transistor 112.1 being controlled via a SELWL signal applied to the gate of this transistor 112.1. The same control signal WRITE is also intended to be applied to the inert electrodes of the third and fourth memory devices 102.3 and 102.4 when a second selection transistor 112.2 is ON, the ON or OFF state of this second selection transistor 112.2 being controlled via a SELWH signal applied to the gate of this transistor 112.2. A first data signal DATA0 is intended to be applied to the active electrodes of the first and third memory devices 102.1 and 102.3 when a third selection transistor 112.3 is ON, the ON or OFF state of this third selection transistor 112.2 being controlled via a SELW signal applied to the gate of this transistor 112.3. A second data signal DATA1 is intended to be applied to the active electrode 106.2 of the second and fourth memory devices 102.2 and 102.4 when a fourth selection transistor 112.4 is ON, the ON or OFF state of this fourth selection transistor 112.4 being controlled via the SELW signal applied to the gate of this transistor 112.4.

The first memory device 102.1 and the third memory device 102.3 are programmed in a complementary manner to prevent the simultaneous interconnection of the two inputs 402.1 and 402.2 on the single output 404.1. Similarly, the second memory device 102.2 and the fourth memory device 102.4 are programmed in a complementary manner to prevent the simultaneous interconnection of the two inputs 402.1 and 402.2 on the output 404.2.

The first input 402.1 is linked to the input of a first tri-state gate 406.1, formed from two PMOS transistors and two NMOS transistors, also receiving at its input the SELW signal and another SELWB signal complementary to the SELW signal (i.e. it will be in state 1 when SELW is in state 0 and vice-versa).

Similarly, the second input 402.2 is linked to the input of a second tri-state gate 406.2 also receiving the SELW and SELWB signals at its input.

The circuit 400 is in switching mode (as opposed to the programming mode wherein the memory states of the memory devices 102.1-102.4 are defined), wherein it switches the inputs 402.1, 402.2 to the desired outputs 404.1, 404.2 when the SELW signal is in state 0, the SELWB signal is in state 1, and the SELWL and SELWH signals are in state 0. In this case, the state 0 or 1 applied to the first input 402.1 occurs on the inert electrodes of the first and second memory devices 102.1, 102.2, and the state 0 or 1 applied to the second input 402.2 occurs on the inert electrodes of the third and fourth memory devices 102.3, 102.4. According to the memory states programmed in the memory devices 102.1-102.4, the states 0 or 1 of one and/or the other of the inputs 402.1 and 402.2 occur on one and/or the other of the outputs 404.1, 404.2.

Figure 9:
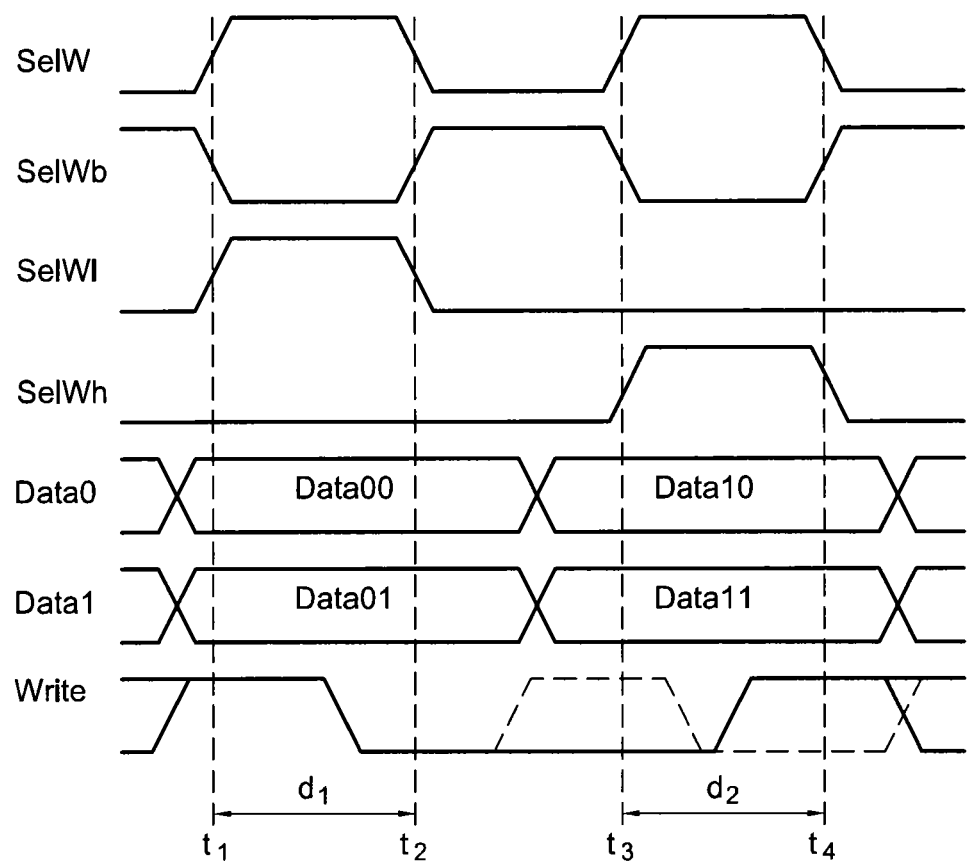
FIG. 9 is an example of a chronogram for signals applied at the input of the electronic circuit according to the fourth embodiment of the invention on implementing a programming method also according to the invention.

This document shall now describe, in relation to the chronogram in FIG. 9, an example of the programming method for the memory devices 102.1-102.4. Given that two data signals are used to program the four memory devices 102.1-102.4, the memory devices 102.1-102.4 are programmed in twos in two distinct phases: in the case shown, the memory devices 102.1 and 102.2 are in a first programming phase and memory devices 102.3 and 102.4 are in a second programming phase.

This programming of the memory devices in two distinct phases is also used to prevent the two inputs 402.1, 402.2 from short-circuiting.

During a first programming phase between $t_1$ and $t_2$, corresponding to a time period $d_1$, the SELW signal changes to state 1 and the SELWB signal changes to state 0, thus changing the circuit 400 to programming mode. The SELWL signal changes to state 1 and the SELWH signal is in state 0, which means that only the two memory devices 102.1 and 102.2 will be programmed (as the state 1 of SELWL turns the first selection transistor 112.1 ON and the state 0 of SELWH turns the second selection transistor 112.2 OFF). During this first phase, the control signal WRITE changes from state 1 to state 0, which results in the storage of the state of the data signal DATA0 in the first memory device 102.1 and the storage of the state of the data signal DATA1 in the second memory device 102.2.

During the period between $t_2$ and $t_3$, the SELW signal changes to state 0 and the SELWB signal changes to state 1, thus changing the circuit 400 to switching mode. The states of the inputs 402.1, 402.2 are therefore routed towards the outputs 404.1, 404.2 according to the storage states of the memory devices 102.1-102.4. During this period, the SELWL and SELWH signals are in state 0 to prevent the control signal WRITE from disrupting the routing of the input signals.

During a second programming phase between $t_3$ and $t_4$, corresponding to a time period $d_2$, the SELW signal changes back to state 1 and the SELWB signal changes back to state 0, thus changing the circuit 400 to programming mode. The SELWL signal stays in state 1 and the SELWH signal changes to state 1, which means that only the two memory devices 102.3 and 102.4 will be programmed (as the state 1 of SELWH turns the second selection transistor 112.2 ON and the state 0 of SELWL turns the first selection transistor 112.1 OFF). During this second programming phase, the control signal WRITE changes from state 0 to state 1, which results in the storage of the state of the data signal DATA0 in the third memory device 102.3 and the storage of the state of the data signal DATA1 in the fourth memory device 102.4.

Alternatively, before beginning this second programming phase, the control signal WRITE can be changed again from state 0 to state 1 so that during the second programming phase, storage in the memory devices is triggered by the change of the control signal WRITE from state 1 to state 0. This alternative embodiment however requires additional energy in relation to the previous case. In all cases, the control signal WRITE can be similar during the different programming phases, regardless of the values of the states in which the memory devices are intended to be programmed (case of the WRITE signal shown as a dotted line during the time period d2, which corresponds to the WRITE signal shown as a solid line during the time period d1).

The different alternative embodiments considered in the electronic circuits described hereinabove can also apply to the electronic circuit 400.

Figure 10:
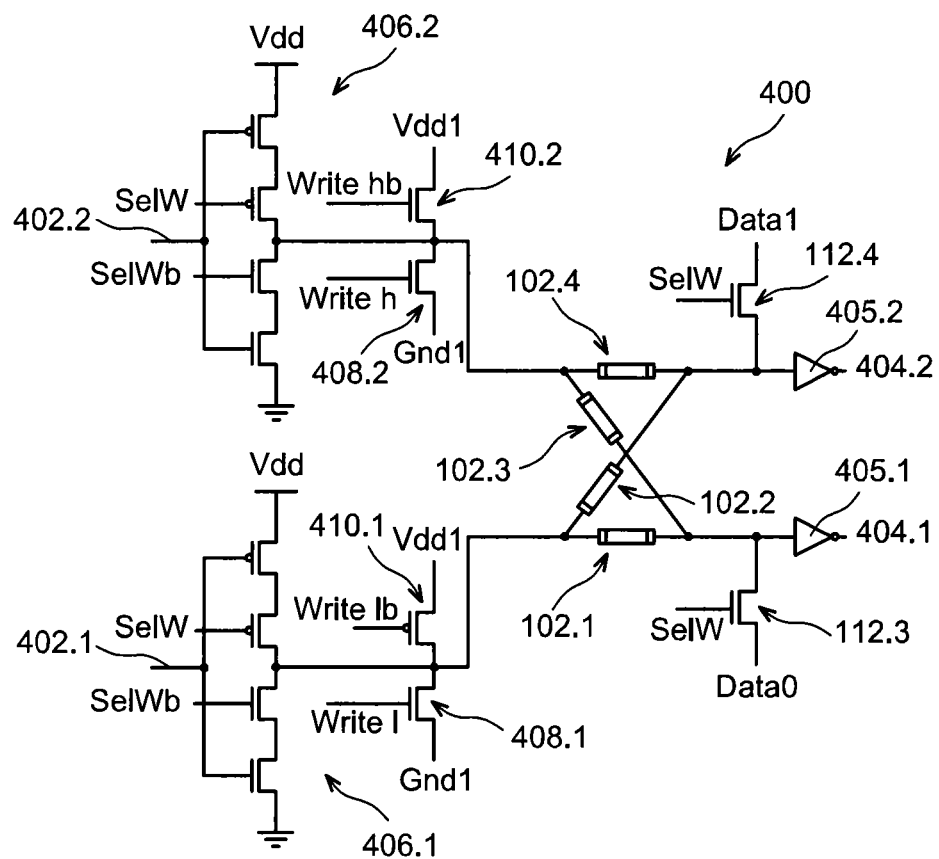
FIG. 10 shows an electronic circuit according to an alternative to the fourth embodiment of the invention.

One alternative embodiment of the electronic circuit 400 is shown in FIG. 10.

Compared to the circuit 400 in FIG. 8, the selection transistors 112.1 and 112.2 are each replaced with two PMOS and NMOS complementary transistors referenced 408.1, 410.1, 408.2 and 410.2 which, according to the states of the four signals WRITEL, WRITELB, WRITEH and WRITEHB (where WRITELB is complementary to WRITEL, and where WRITEHB is complementary to WRITEH), apply a potential $V_{DD1}$ or a zero reference potential Gnd1 on the inert electrodes of the memory devices 102.1-102.4.

This alternative embodiment clearly differentiates between the operating voltages and the programming voltages, which therefore prevents the modification of the resistance state under normal operation (transmission of signals from the input to the output). Voltages lower than the programming threshold of the resistances are used in this case.

In order to reduce the amount of energy consumed by certain integrated circuits, power switches are used to cut off the power supply to units not used in these integrated circuits. The use of retention flip flops can in some instances be advantageous in saving all or part of the unit internal state during this power cut. A flip-flop is formed from two latch devices, connected in series: one is a master and the other is a slave. In a retention flip-flop, part of the slave latch device retains the information and is able to retrieve it when the power supply is restored. For example, a permanent power supply can be used in part of the slave latch device. In order to remove this permanent power supply, the slave (or master) latch device can contain resistive memory devices, as described by the example provided in the document by W. Zhao et al., entitled "Spin-MTJ based Non-Volatile Flip-Flop", Proceedings of the 7$^{th}$ IEEE International Conference on Nanotechnology, Aug. 2-5, 2007, Hong Kong.

Figure 11:
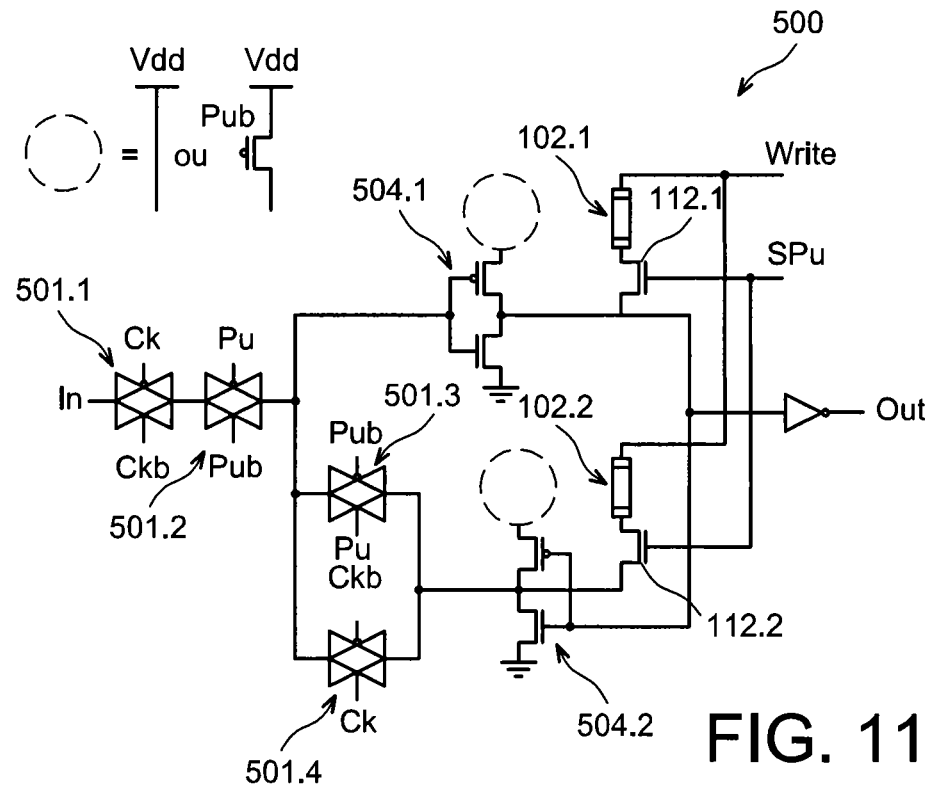
FIG. 11 shows an electronic circuit according to a fifth embodiment of the invention, comprising multiple bipolar switching non-volatile memory devices intended to be programmed by implementing a programming method also according to the invention.

Bipolar non-volatile memory devices programmed via a method similar to that described hereinabove can advantageously be used to produce such latch devices. FIG. 11 therefore shows an electronic circuit 500 according to a fifth embodiment, comprising bipolar non-volatile memory devices programmed in a similar manner to the memory devices described hereinabove. This electronic circuit 500 represents the slave latch device of a retention flip-flop using two bipolar memory resistive devices 102.1 and 102.2 which are programmed in a similar manner to that described hereinabove.

The two memory devices 102.1 and 102.2 have the same orientation in this figure, i.e. each comprise their active electrode, electrically linked to a common input on which is applied a control signal WRITE.

Figure 12:
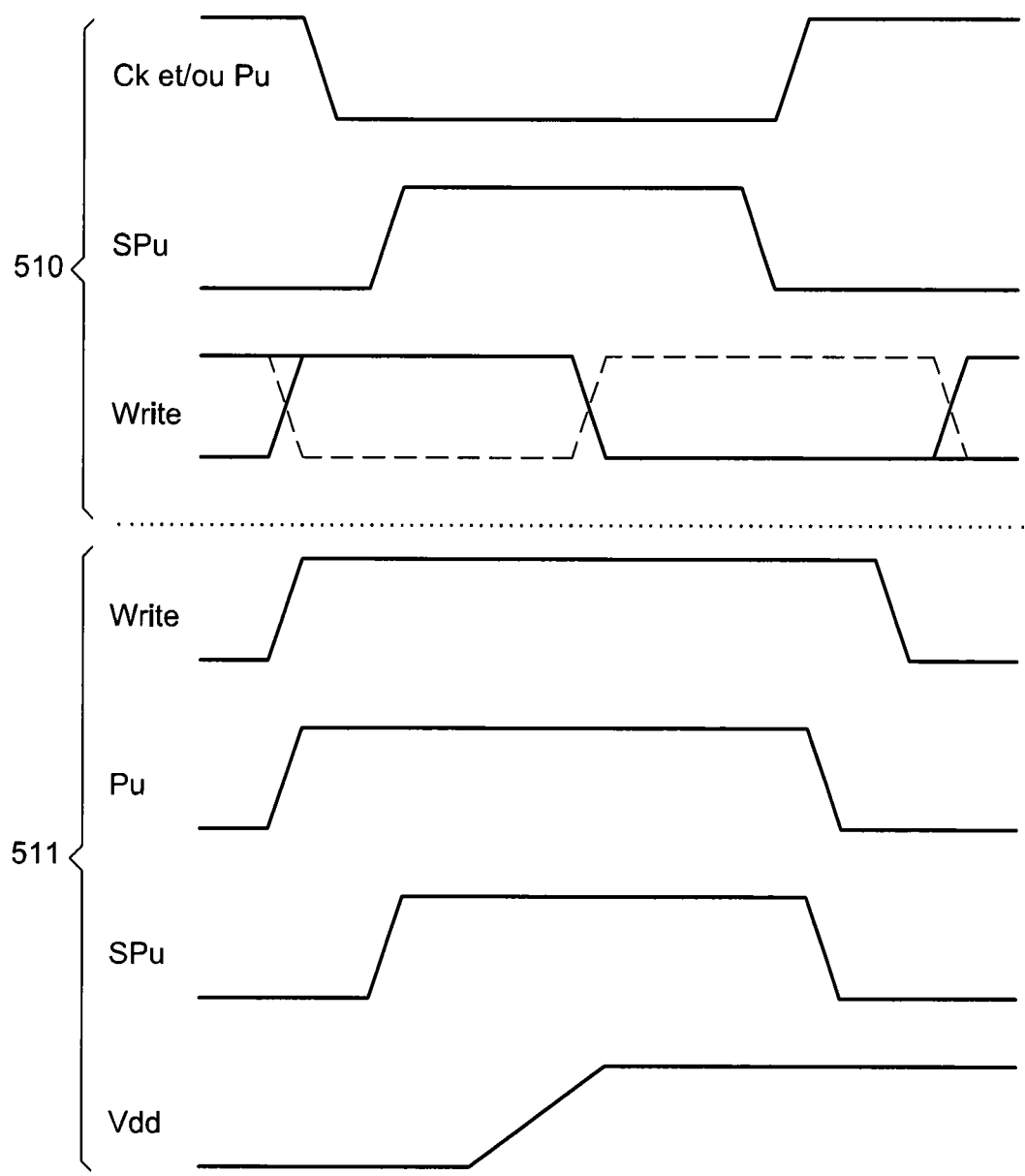
FIG. 12 is an example of a chronogram for signals applied at the input of the electronic circuit according to the fifth embodiment of the invention on implementing a programming method also according to the invention.

The device 500 comprises an input "In" and four CMOS transmission gates 501.1 to 501.4 controlled by signals Ck and Pu (and their complementary signals Ckb and Pub) and an output "Out". The internal state of the device 500, corresponding to the outputs of two CMOS inverters 504.1 and 504.2, the inputs of which are linked to the CMOS transmission gates 501.2 to 501.4, is copied over into the two memory devices 102.1 and 102.2 by making two access transistors 112.1 and 112.2 conductive via a selection signal SPu applied to their gates (the inert electrodes of the memory devices 102.1 and 102.2 are linked to the drains of the transistors 112.1 and 112.2 respectively), then by performing a transition (change from state 0 to state 1, or change from state 1 to state 0) on the WRITE signal. One of the two memory devices 102.1, 102.2 is programmed when the WRITE signal is in state 1, and the other is programmed when the WRITE signal is in state 0. The signals 510 shown in FIG. 12 correspond to the signals Ck, Pu, SPu and WRITE during this phase for programming the memory devices 102.1 and 102.2.

After a power cut phase, the two memory devices 102.1 and 102.2 are used to restore the internal nodes of the device 500 to the initial state, at the outputs of the CMOS inverters CMOS 504.1 and 504.2.

Before powering back on, the Pu signal is activated (set to state 1) to close off the device 500 and disconnect it from the master latch device to which the slave latch device 500 is coupled. The memory devices 102.1 and 102.2 are linked to the internal nodes by activating the SPu signal (set to state 1). The WRITE signal changes to state 1 (link to Vdd). When powering back on, the resistances of the memory devices 102.1 and 102.2 (one in the high state and the other in the low state) create an imbalance which will force the slave latch device 500 to its initial state. The complementary programming of the memory devices 102.1 and 102.2 is used to correctly reset the slaves latch device 500 on powering back on, naturally, as the two internal nodes of the circuit are still in opposite states (as separated by an inverter).

In order to ease this reset, it may be useful to disconnect the PMOS transistors from the CMOS inverters 504.1 and 504.2 closed off from the device 500 during this powering back on. In this case, the circles shown as dotted lines each correspond to an MOS transistor, used or not to apply the Vdd voltage to the CMOS inverters 504.1 and 504.2. The signals 512 shown in FIG. 12 correspond to the WRITE, Pu, SPu and Vdd signals during this powering on phase of the slave latch device 500.

Figure 13:
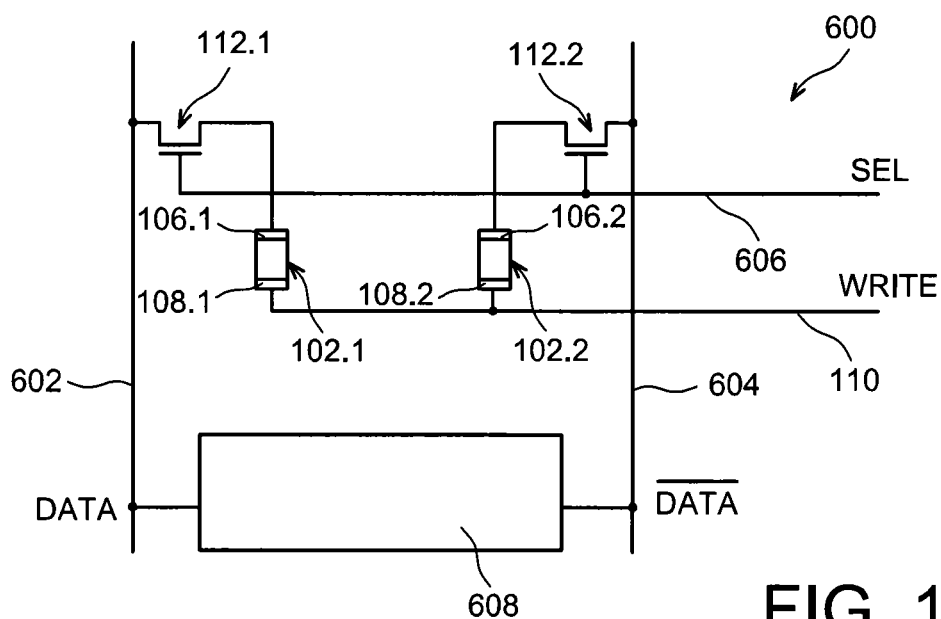
FIG. 13 shows an electronic circuit according to a sixth embodiment of the invention, comprising multiple bipolar switching non-volatile memory devices intended to be programmed by implementing a programming method also according to the invention.

FIG. 13 shows an electronic circuit 600 according to a sixth embodiment, forming an RRAM-type differential cell and comprising bipolar non-volatile memory devices programmed in a similar manner to the memory devices described hereinabove. Such a cell is in particular designed to form one of the multiple memory cells of a memory circuit.

The circuit 600 comprises a first memory device 102.1, the inert electrode 108.1 of which is linked to a first electrically conductive line 110 (which can be positioned in a column and linked to other memory devices) to which is applied a control signal WRITE and the active electrode 106.1 of which is linked to the source of a first access transistor 112.1, and also comprises a second memory device 102.2, the inert electrode 108.2 of which is also linked to the first electrically conductive line 110 and the active electrode 106.2 of which is linked to the source of a second access transistor 112.2. The drain of the first access transistor 112.1 is linked to a second electrically conductive line 602 to which is applied a first data signal DATA and the drain of the second access transistor 112.2 is linked to a third electrically conductive line 604 to which is applied a second data signal /DATA, the state of which is complementary to that of the first data signal DATA. The electrically conductive lines 602 and 604 are oriented in columns so as to be linked to other memory cells. The gates of the two transistors 112.1 and 112.2 are linked to a fourth electrically conductive line 606 to which is applied a selection signal SEL. In the differential memory cell 600, the two memory devices 102.1 and 102.2 are designed to be programmed in a complementary manner.

The fourth electrically conductive line 606 corresponds to a word selection line. Aside from providing access to the memory devices 102.1 and 102.2 when programming these devices, the access transistors are used to limit the current flowing through these memory devices 102.1 and 102.2.

Figure 14:
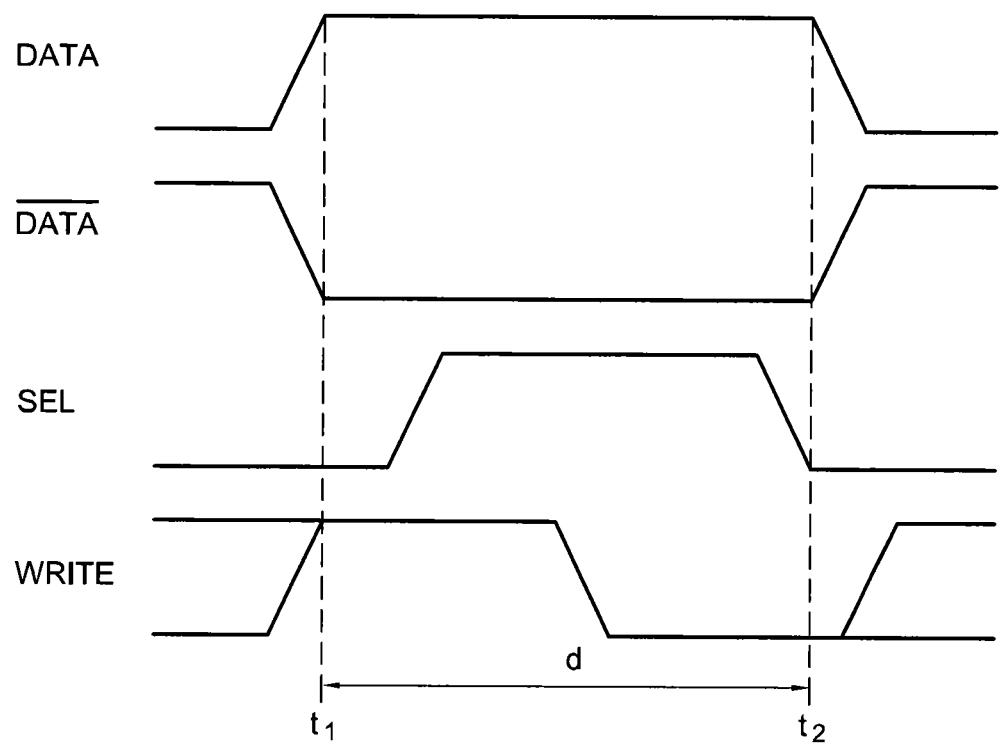
FIG. 14 is an example of a chronogram for signals applied at the input of the electronic circuit according to the sixth embodiment of the invention on implementing a programming method also according to the invention.

FIG. 14 shows a chronogram for the signals of the circuit 600 when programming the memory devices 102.1 and 102.2 During the period between $t_1$ and $t_2$, corresponding to a time period d, the first data signal DATA changes to state 1 and the second data signal /DATA changes to state 0. The control signal WRITE also changes to state 1 at around time $t_1$ (or stays in state 1). Between $t_1$ and $t_2$, the SEL signal changes to state 1, thus turning the access transistors 112.1 and 112.2 ON and causing the second memory device 102.2 to change to the high state. The control signal WRITE then changes to state 0, causing the first memory device 102.1 to change to the low state. A little before time $t_2$, the SEL signal changes back to state 0. The data signals DATA and /DATA can therefore change state without modifying the memory state of the memory devices 102.1 and 102.2. The programming alternatives described hereinabove can apply to the programming of memory devices 102.1, 102.2 of this circuit 600.

Such a differential memory cell can be coupled to one or multiple SRAM-type memory cells 608 programmed via the same data signals DATA and /DATA.

Alternatively, the inert electrode of one of the memory devices 102.1, 102.2 can be linked to the source of the corresponding access transistor, and the active electrode of this memory device can therefore be linked to the first electrically conductive line 110. In this case, when programming the memory devices 102.1 and 102.2, the same data signal flows through the electrically conductive lines 602 and 604. The two memory devices 102.1 and 102.2 are therefore programmed during the same part of the time period d (when the WRITE signal is in state 0 or 1). However, as the programming time from the high state to the low state is less than the programming time from the low state to the high state, this prevents the circuit 600 from having an unwanted transitory state wherein the two memory devices 102.1 and 102.2 are in the low state simultaneously.

The electronic circuits 100 to 600 are generally produced in large quantities within FPGA-type circuits, wherein the signals used are pooled between all of the electronic circuits.

The invention claimed is:

1. An electronic circuit comprising:
   a first bipolar switching memory device comprising first and second electrodes at terminals of which a programming voltage programming the first memory device in a high-resistance or low-resistance state can be applied during a programming operation;
   a first circuitry configured to generate a data signal during the programming operation having a first data state which is constant over the programming operation or a second data state which is constant for only a portion of the programming operation less than an entirety of the programming operation, a time period d being defined when said data signal is in the second state during the programming operation, the first and second data states corresponding to states 0 and 1 and being representative of the state in which the first memory device is configured to be programmed, and apply the data signal to the first electrode of the first memory device;
   a second circuitry configured to apply, to the second electrode of the first memory device, a control signal that alternates at least once, during time period d, between a state 1 and a state 0, the control signal being applied identically with an identical voltage change when programming the first memory device in the high-resistance state and when programming the first memory device in the low-resistance state;
   wherein states 0 and 1 of the data signal and of the control signal correspond to zero and positive electric potentials respectively, forming the programming voltage when one of either the data signal or control signal is in state 0 and the other of either the data signal or control signal is in state 1;
   the electronic circuit further comprising a selection device electrically linked to the first memory device and configured to allow a current to flow through the first memory device, the selection device being driven by a selection signal transitioning between state 0 and state 1 after a beginning of time period d and transitioning between state 1 and state 0 before an end of time period d or the selection device being driven by a selection signal transitioning between state 1 and state 0 after the beginning of time period d and transitioning between state 0 and state 1 before the end of time period d, for each of the constant states of 0 and 1 of the data signal;
   and wherein the change from one of states 0 or 1 of the control signal to the other of states 0 or 1 of the control signal is controlled during the programming operation.

2. The electronic circuit according to claim 1, wherein the first memory device is a CBRAM or RRAM-type device, the first and second electrodes respectively corresponding to an active electrode and an inert electrode of the first memory device, or vice-versa.

3. The electronic circuit according to claim 1, wherein the control signal is in state 1 during a first part of the time period d and in state 0 during a second part of the time period d, the first part of the time period d corresponding to a duration substantially equal to that of the second part of the time period d.

4. The electronic circuit according to claim 1, wherein the control signal alternates multiple times between states 1 and 0 during the time period d.

5. The electronic circuit according to claim 1, wherein one of the first and second electrodes is electrically linked to the source or to the drain of at least one first selection MOS transistor, forming part of the selection device and configured to be in the ON state during the programming operation.

6. The electronic circuit according to claim 1, wherein the second circuitry includes a first electrically conductive line electrically linked to the second electrode, and wherein the first circuitry includes a second electrically conductive line electrically linked to the first electrode.

7. The electronic circuit according to claim 1, further comprising a second memory device programmed in a complementary state to that in which the first memory device is programmed, wherein the second electrode of the first memory device is electrically linked to one of a first electrode and second electrode of the second memory device, and further comprising third circuitry configured to apply a second data signal to the other of the first electrode and second electrode of the second memory device.

8. The electronic circuit according to claim 7, further comprising a second MOS transistor, an ON or OFF state of which depends on the complementary states in which the first memory device and the second memory device are programmed, and which form a voltage divider bridge, and wherein the second electrode of the first memory device is electrically linked to a gate of the second MOS transistor.

9. The electronic circuit according to claim 7, further comprising a multiplexer, and wherein the first memory device and the second memory device form a memory cell, one output of which is electrically linked to the second electrode of the first memory device and to one of the data inputs of the multiplexer.

10. A programmable interconnection system carrying at least one signal applied to one of a plurality of inputs of the programmable interconnection system towards at least one of a plurality of outputs of the programmable interconnection system, comprising:
    a plurality of electronic circuits according to claim 1, the electronic circuits comprising bipolar switching memory devices, the programming states of which determine the interconnection states between the inputs and outputs of the programmable interconnection system.

11. A latch device for a retention flip-flop, comprising:
    at least two electronic circuits according to claim 1,
    wherein the second electrode of the memory device of a first of the two electronic circuits is electrically linked to one of the first and second electrodes of the memory device of a second of the two electronic circuits, such that the same control signal is applied to the second electrode of the memory device of the first electronic circuit and to the one of the first and second electrodes of the memory device of the second electronic circuit, the first electrode of the memory device of the first electronic circuit being electrically linked to an output of a first CMOS inverter via a first MOS transistor, and the other of the first and second electrodes of the memory device of the second electronic circuit being electrically linked to an output of a second CMOS inverter via a second MOS transistor.

12. A differential memory cell, comprising:
at least two electronic circuits according to claim 1,
wherein the second electrode of the memory device of a first of the two electronic circuits is electrically linked to one of the first and second electrodes of the memory device of a second of the two electronic circuits, programmed in a complementary state to that in which the memory device of the first electronic circuit is programmed, a second data signal inverse to that applied to the first electrode of the memory device of the first electronic circuit being applied to the other of the first and second electrodes of the memory device of the second electronic circuit.

13. A method for programming a first bipolar switching memory device comprising first and second electrodes at the terminals of which a programming voltage programming the first memory device in a high-resistance or low-resistance state can be applied during a programming operation, the method comprising:
generation of a data signal during the programming operation having a first data state which is constant over the programming operation or a second data state which is constant for only a portion of the programming operation less than the entire programming period, a time period d being defined when said data signal is in the second state during the programming operation, the first and second data states corresponding to states 0 and 1 and being representative of the state in which the first memory device is configured to be programmed, and apply the data signal to the first electrode of the first memory device;
application, to the second electrode of the first memory device, of a control signal that alternates at least once, during time period d, between a state 1 and a state 0, the control signal being applied identically with an identical voltage change when programming the first memory device in the high-resistance state and when programming the first memory device in the low-resistance state;
wherein states 0 and 1 of the data signal and of the control signal correspond to zero and positive electric potentials respectively, forming the programming voltage when one of either the data signal or control signal is in state 0 and the other of either the data signal or control signal is in state 1;
wherein the first memory device is electrically linked to a selection device such that the selection device allows a current to flow through the first memory device, the selection device being driven by a selection signal transitioning between state 0 and state 1 after a beginning of time period d and transitioning between state 1 and state 0 before an end of time period d or the selection device being driven by a selection signal transitioning between state 1 and state 0 after the beginning of time period d and transitioning between state 0 and state 1 before the end of time period d, for each of the constant states of 0 and 1 of the data signal;
and wherein a change from one of states 0 and 1 of the control signal to the other of states 0 and 1 of the control signal is included in the programming operation.

14. The method according to claim 13, wherein the control signal is in state 1 during a first part of the time period and in state 0 during a second part of the time period d, the first part of the time period d corresponding to a duration substantially equal to that of the second part of the time period d.

15. The method according to claim 13, wherein the control signal alternates multiple times between states 1 and 0 during the time period d.

16. The method according to claim 13, wherein one of the first and second electrodes is electrically linked to a source or to a drain of at least one first selection MOS transistor, forming part of the selection device, the first selection MOS transistor being in the ON state during the programming operation.

17. The electronic circuit according to claim 1, wherein when the data signal is at the state 0, the first memory device is programmed before the control signal alternates between the state 1 and the state 0.

18. An electronic circuit, comprising:
a first bipolar switching memory device having first and second electrodes;
a second bipolar switching memory device having third and fourth electrodes, the third electrode being connected to the second electrode at a node;
a first conductive line;
a first transistor having a first active region connected to the node, a second active region connected to the first conductive line, and a first gate;
a second transistor having third and fourth active regions and a second gate, the second gate begin connected to the node; and
circuitry configured to:
generate a control signal and apply the control signal to the first conductive line;
generate a selection signal and apply the selection signal to the gate of the first transistor; and
generate first and second data signals and apply the first and second data signals to the first electrode and the fourth electrode, respectively.

19. The electronic circuit according to claim 18, wherein the circuitry is configured to:
generate the first and second data signals during a programming operation each being held at a constant first data state 0 or a constant second data state 1 during the programming operation, a time period d being defined as when the first and second data signals are both constant at either state 0 and state 1 during the programming operation, and apply the first data signal to the first electrode and apply the second data signal to the fourth electrode;
generate the control signal and apply the control signal to the second electrode, the control signal alternating at least once, during a time period when then second data signal is in a constant state during the programming operation, between a state 0 and a state 1; and
generate the selection signal transitioning between state 0 and state 1 after a beginning of the time period and transitioning between state 1 and state 0 before an end of the time period d or transitioning between state 1 and state 0 after the beginning of the time period and transitioning between state 0 and state 1 before the end of the time period d, for each of the constant states of 0 and 1 of the data signal.

* * * * *